(12) United States Patent
Yoon et al.

(10) Patent No.: US 10,199,328 B2
(45) Date of Patent: Feb. 5, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Chan Sic Yoon, Anyang-si (KR); Ki Seok Lee, Busan (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 146 days.

(21) Appl. No.: 15/258,138

(22) Filed: Sep. 7, 2016

(65) Prior Publication Data
US 2017/0194261 A1 Jul. 6, 2017

(30) Foreign Application Priority Data
Jan. 6, 2016 (KR) .................. 10-2016-0001526

(51) Int. Cl.
| | | |
|---|---|---|
| H01L 23/535 | (2006.01) | |
| H01L 23/485 | (2006.01) | |
| H01L 29/06 | (2006.01) | |
| H01L 29/423 | (2006.01) | |
| H01L 27/108 | (2006.01) | |

(52) U.S. Cl.
CPC .......... *H01L 23/535* (2013.01); *H01L 23/485* (2013.01); *H01L 27/10814* (2013.01); *H01L 29/0649* (2013.01); *H01L 29/4236* (2013.01)

(58) Field of Classification Search
CPC .. H01L 23/535; H01L 29/0649; H01L 23/485
See application file for complete search history.

(56) References Cited

U.S. PATENT DOCUMENTS

| | | |
|---|---|---|
| 8,134,195 B2 | 3/2012 | Lee et al. |
| 8,835,315 B2 | 9/2014 | Byun et al. |
| 8,912,629 B2 | 12/2014 | Seo |
| 9,034,718 B2 | 5/2015 | Suzuki et al. |
| 9,147,685 B2 | 9/2015 | Byun et al. |
| 9,287,270 B2 | 3/2016 | Oh et al. |
| 2005/0266636 A1* | 12/2005 | Kitamura .......... H01L 21/76838 438/241 |
| 2010/0127317 A1 | 5/2010 | Yamazaki |
| 2012/0098132 A1 | 4/2012 | Park et al. |

FOREIGN PATENT DOCUMENTS

| | | |
|---|---|---|
| JP | 2014-022457 A | 2/2014 |
| JP | 2014-165230 A | 9/2014 |
| KR | 10-2011-0089028 A | 8/2011 |
| KR | 10-2012-0098127 A | 9/2012 |
| KR | 10-2014-0048505 A | 4/2014 |
| KR | 10-2015-0039361 A | 4/2015 |

* cited by examiner

*Primary Examiner* — Marc Armand
(74) *Attorney, Agent, or Firm* — Lee & Morse P.C.

(57) ABSTRACT

A semiconductor device includes a first contact plug on a substrate, a first lower electrode disposed on the first contact plug and extended in a thickness direction of the substrate, a first supporter pattern on the first lower electrode and including an upper surface and a lower surface, the upper surface of the first supporter pattern being higher than a top surface of the first lower electrode, a dielectric film on the first lower electrode, the upper surface of the first supporter pattern and the lower surface of the first supporter pattern and an upper electrode disposed on the dielectric film.

20 Claims, 16 Drawing Sheets

SEMICONDUCTOR DEVICE AND METHOD FOR FABRICATING THE SAME

CROSS-REFERENCE TO RELATED APPLICATION

Korean Patent Application No. 10-2016-0001526, filed on Jan. 6, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

As recent semiconductor devices continue to provide larger capacity and higher integration, design rules are also ever decreasing. Such trend also appears in dynamic random-access memory devices (DRAMs), a type of memory semiconductor devices. To be operated, a DRAM device requires a capacitance above a minimum level per cell. To this end, research is on going into methods for increasing the contact area between the lower electrode of a capacitor and a dielectric film.

SUMMARY

According to some embodiments, there is provided a semiconductor device including, a first contact plug on a substrate, a first lower electrode disposed on the first contact plug and extended in a thickness direction of the substrate, a first supporter pattern disposed on the first lower electrode and including an upper surface and a lower surface, the upper surface of the first supporter pattern being higher than a top surface of the first lower electrode, a dielectric film formed on the first lower electrode, the upper surface of the first supporter pattern and the lower surface of the first supporter pattern and an upper electrode disposed on the dielectric film.

According to some embodiments, there is provided a semiconductor device including a first contact plug on a substrate, a first supporter pattern disposed on the substrate and including a first surface and a second surface opposed to each other, a first lower electrode disposed between the substrate and the first surface of the first supporter pattern and connected to the first contact plug, a dielectric film formed on the first lower electrode, the first surface of the first supporter pattern and the second surface of the first supporter pattern and an upper electrode disposed on the dielectric film.

According to some embodiments, there is provided a semiconductor device including a first contact plug on a substrate, a first lower electrode on the first contact plug, the first lower electrode having a pillar shape, a first supporter pattern on the first lower electrode, a distance between a top of the substrate and a top of the first supporter pattern being larger than a distance between the top of the substrate and a top of the first lower electrode, a dielectric film on the first lower electrode and on the first supporter pattern, and an upper electrode on the dielectric film.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device according to some exemplary embodiments will be described with reference to FIG. 1.

Figure 1:
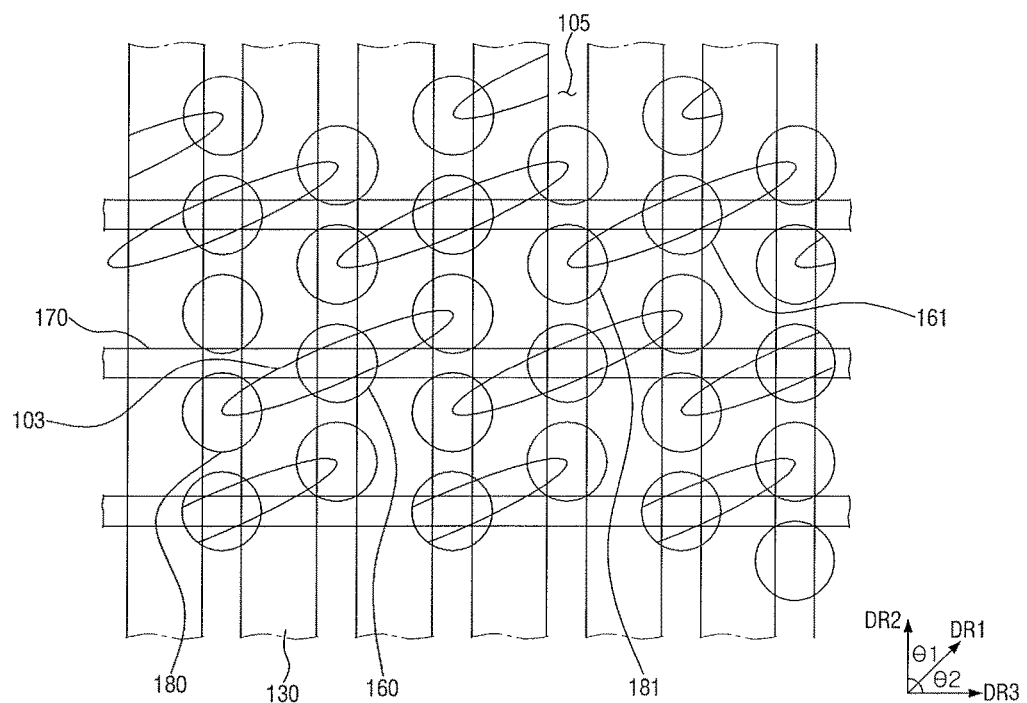
FIG. 1 illustrates a diagram of a layout of a semiconductor device according to some exemplary embodiments.

FIG. 1 is a diagram for illustrating a layout of a semiconductor device according to some exemplary embodiments, before a capacitor is formed.

Referring to FIG. 1, in a semiconductor device according to some exemplary embodiments, a unit active area 103 is defined by forming an isolation region 105 in a substrate. Specifically, the unit active area 103 is extended in a first direction DR1, a gate electrode, i.e., a word line 130, is extended in a second direction DR2 making an acute angle with the first direction DR1, and a bit line 170 is extended in a third direction DR3 making an acute angle with the first direction DR1. However, this is merely illustrative, e.g., the gate electrode 130 may be extended in the same direction as the unit active area 103.

As used herein, in the phrase "a direction makes an angle with another direction," the angle refers to a smaller one of two angles made by the two directions. For example, when angles 120° and 60° are made by two directions, the angle refers to 60°. Accordingly, as shown in FIG. 1, the angle made by the first direction DR1 and the second direction DR2 is θ1, and the angle made by the first direction DR1 and the third direction DR3 is θ2.

The directions are determined to make acute angles θ1 and θ2, in order to make the distance between a bit line contact 160 connecting the unit active area 103 with the bit line 170 and a storage node contact 180 connecting the unit active area 103 with a capacitor (a second contact plug shown in FIG. 3) as large as possible. For example, the angles θ1 and θ2 may be, but are not limited to, 45° and 45°, 30° and 60°, or 60° and 30°, respectively.

Hereinafter, a semiconductor device according to some exemplary embodiments will be described with reference to FIGS. 1 to 4.

Figure 2:
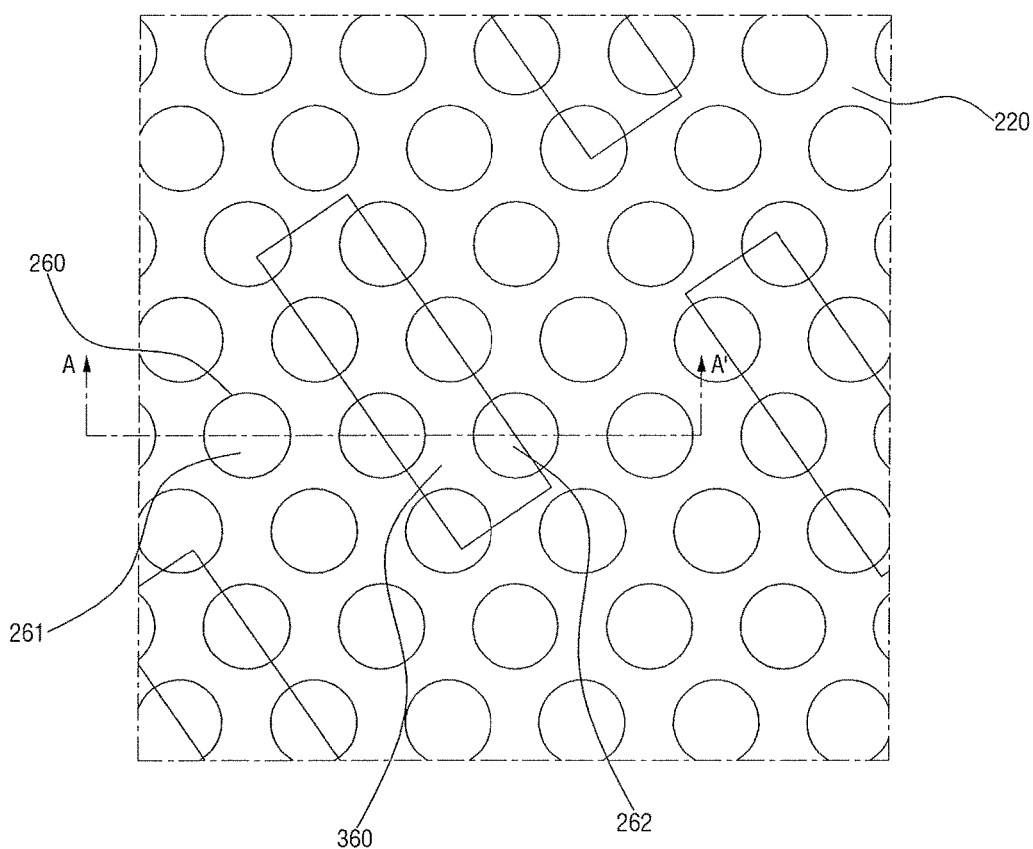
FIG. 2 illustrates a diagram of a layout of a semiconductor device according to some exemplary embodiments.
Figure 3:
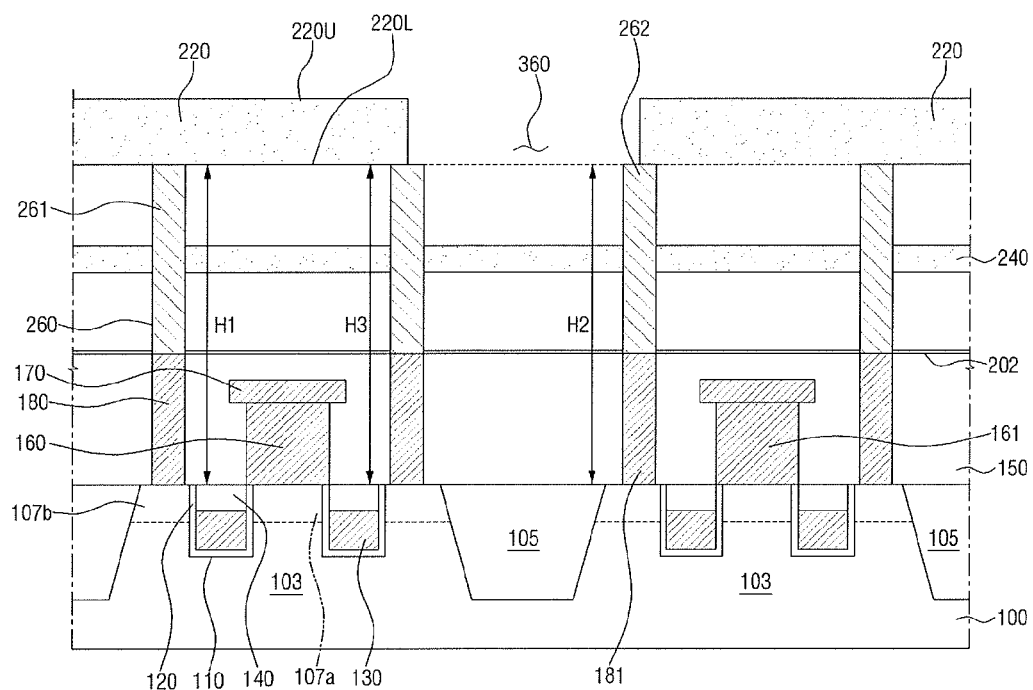
FIGS. 3 to 6 illustrate cross-sectional views along line A-A' of FIGS. 1 and 2.
Figure 4:
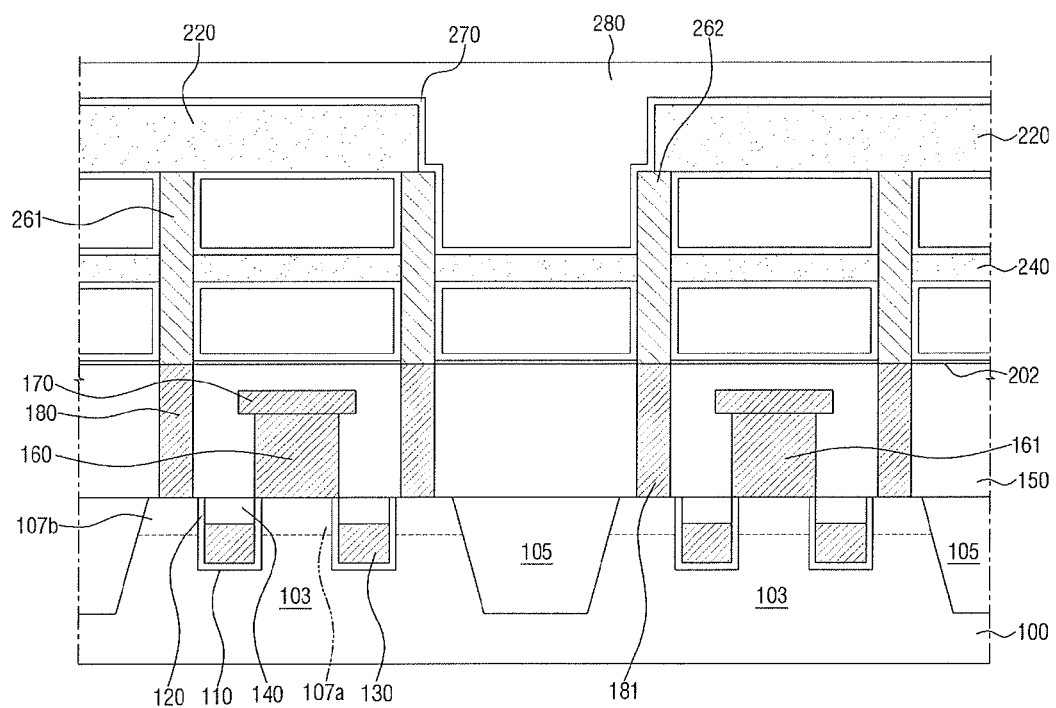

FIG. 2 is a diagram for illustrating a layout of a semiconductor device according to some exemplary embodiments after a capacitor is formed. FIG. 3 is a cross-sectional view of the semiconductor device of FIGS. 1 and 2 taken along line A-A', before a capacitor dielectric film 270 and an upper electrode 280 are formed. FIG. 4 is a cross-sectional view of the semiconductor device of FIGS. 1 and 2 taken along line A-A', after the capacitor dielectric film 270 and the upper electrode 280 are formed.

Referring to FIGS. 1 to 4, the semiconductor device according to an exemplary embodiment may include a substrate 100, a first lower electrode 261, a second lower electrode 262, a first supporter pattern 220, a second supporter pattern 240, the capacitor dielectric film 270, the upper electrode 280, and an opening 360. Although the first lower electrode 261, the second lower electrode 262, and the like are arranged in a honeycomb pattern in FIG. 2, the present disclosure is not limited thereto. For example, the first and second supporters 220 and 240 provide support in order to prevent leaning of the pillar-shaped first and second electrodes 261 and 262.

The substrate 100 may be, e.g., a bulk silicon substrate or a SOI (silicon-on-insulator) substrate. Alternatively, the substrate 100 may be a silicon substrate or may be a substrate made of other materials, e.g., silicon germanium (SiGe), indium antimonide (InSb), lead-telluride (PbTe) compound, indium arsenide (InAs), indium phosphide (InP), gallium arsenide (GaAs) and gallium antimonide (GaSb). Alternatively, the substrate 100 may be formed by growing an epitaxial layer on a base substrate. In the following description, a silicon substrate will be described as an example of the substrate 100. The substrate 100 may be of, but is not limited to, a first conductive type, e.g., p-type.

The bit line 170 or the gate electrode 130, which may be used as a word line, may be disposed between the substrate 100 and the first lower electrode 261, and between the substrate 100 and the second lower electrode 262, respectively.

In detail, in the substrate 100, the unit active areas 103 and isolation regions 105 may be formed. For example, two or more transistors may be formed in each of the unit active areas 103. The two transistors may include two gate electrodes 130 traversing the unit active area 103, a first source/drain region 107a formed in the unit active area 103 between the two gate electrodes 130, and a second source/drain region 107b formed between each of the gate electrodes 130 and the isolation regions 105. That is, the two transistors may share the first source/drain region 107a but may not share the second source/drain region 107b.

A gate insulation film 120 may be formed along side walls and a bottom surface of a first trench 110 formed in the substrate 100. The gate insulation film 120 may include silicon oxide or a high-k dielectric material having a dielectric constant higher than that of silicon oxide.

The first trench 110 may be filled with the gate electrode 130 not completely but partially. In other words, the gate electrode 130 may have a recessed shape. The gate electrode 130 may be made of, but is not limited to, doped polysilicon, titanium nitride (TiN), tantalum nitride (TaN), tungsten nitride (WN), titanium (Ti), tantalum (Ta), tungsten (W), etc.

A capping pattern 140 may be formed on the gate electrode 130 to fill a remaining part of the first trench 110, i.e., a portion of the first trench 110 above the gate electrode 130 is filled with the capping pattern 140. The capping pattern 140 may include an insulating material, e.g., at least one of silicon oxide, silicon nitride and silicon oxynitride.

An interlayer insulation layer 150 may be formed on the substrate 100. The interlayer insulation layer 150 may be a single layer or multiple layers. The interlayer insulation layer 150 may include at least one of, e.g., a low-k dielectric material, an oxide film, a nitride film and an oxynitride film. The low-k dielectric material may be made of, e.g., flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP), plasma enhanced oxide (PEOX), flowable CVD (FCVD) or a combination thereof.

A first contact plug 180 and a second contact plug 181 may be formed in, e.g., through, the interlayer insulation layer 150 on the substrate 100 such that they penetrate the interlayer insulation layer 150. The first contact plug 180 may be electrically connected to the second source/drain region 107b. Likewise, the second contact plug 181 may also be electrically connected to a second source/drain region. The first contact plug 180 and the second contact plug 181 may include a storage node contact. Each of the first contact plug 180 and the second contact plug 181 may include a conductive material. Each of the first contact plug 180 and the second contact plug 181 may include, but is not limited to, at least one of polycrystalline silicon, a metal-silicide compound, conductive metal nitride and metal.

The third contact plug 160 may be electrically connected to the first source/drain region 107a in, e.g., through, the interlayer insulation layer 150. Likewise, the fourth contact plug 161 may also be electrically connected to a source/drain region. Each of the third contact plug 160 and the fourth contact plug 161 may include a conductive material. Each of the third contact plug 160 and the fourth contact plug 161 may include, but is not limited to, at least one of polycrystalline silicon, a metal-silicide compound, conductive metal nitride and metal.

The bit line 170 may be formed on and electrically connected to each of the third contact plug 160 and the fourth contact plurality of 161. The bit line 170 may include a conductive material. For example, the bit line 170 may include, but is not limited to, at least one of polycrystalline silicon, a metal-silicide compound, conductive metal nitride and metal.

The bit line 170 may include a longer side and a shorter side. The longer side of the bit line 170 may be extended in the third direction DR3. The shorter side of the bit line 170 may be extended in the second direction DR2 intersecting the third direction DR3. The longer side of the bit line 170 may be longer than the shorter line thereof. The longer side of the bit line 170 may face the shorter line thereof.

The bit line 170 may further include a bit line spacer formed on the longer side thereof. The bit line spacer may be extended in the third direction DR3 along the longer side of the bit line 170.

The first lower electrode 261 may be formed on the first contact plug 180. The first lower electrode 261 may be extended in the thickness direction of the substrate 100. Specifically, the first lower electrode 261 may be formed on the interlayer insulation layer 150 that covers the gate electrode 130 and the bit line 170. The first lower electrode 261 may be electrically connected to the first contact plug 180 disposed thereunder.

The second lower electrode 262 may be formed on the second contact plug 181. The second lower electrode 262 may be extended in the thickness direction of the substrate 100. Specifically, the second lower electrode 262 may be formed on the interlayer insulation layer 150. The second lower electrode 262 may be electrically connected to the second contact plug 181.

In the semiconductor device according to some embodiments, the first lower electrode 261 and the second lower electrode 262 may have a pillar shape. In the semiconductor device according to some exemplary embodiments, the height H1 from the substrate 100 to the top of the first lower electrode 261 may be equal to the height H2 from the substrate 100 to the top of the second lower electrode 262. Each of the first lower electrode 261 and the second lower electrode 262 may include at least one of doped polysilicon, a conductive metal nitride (e.g., titanium nitride (TiN), tantalum nitride (TaN), tungsten nitride (WN), etc.), a metal (e.g., ruthenium, iridium, titanium, tantalum, etc.), and a conductive metal oxide (e.g., iridium oxide).

The first supporter pattern 220 may be formed on the first lower electrode 261. The first supporter pattern 220 may include an upper surface 220U and a lower surface 220L. The upper surface 220U and the lower surface 220L of the first supporter pattern 220 may face each other.

The lower surface 220L of the first supporter pattern 220 may be connected to the top surface of the first lower electrode 261. In other words, the first lower electrode 261 may be formed between the substrate 100 and the lower surface 220L of the first supporter pattern 220. The first lower electrode 261 may be connected to the first contact plug 180.

The height from the substrate 100 to the upper surface 220U of the first supporter pattern 220 may be different from the height H1 from the substrate 100 to the first lower electrode 261. For example, the upper surface 220U of the first supporter pattern 220 may be higher than the top surface of the first lower electrode 261 from the substrate 100.

In the semiconductor device according to some exemplary embodiments, the height H3 from the substrate 100 to the lower surface 220L of the first supporter pattern 220 may be equal to the height H1 from the substrate 100 to the top surface of the first lower electrode 261. In other words, the first lower electrode 261 may not extend into the first supporter pattern 220 formed on the top surface thereof.

The first supporter pattern 220 may include the opening 360 via which a part of the top surface of the second lower electrode 262 is exposed. In other words, a part of the second contact plug 181 may be overlapped with the opening 360 included in the first support pattern 220. The second lower electrode 262 may be connected to the second contact plug 181. The first supporter pattern 220 may expose only a part of the top surface of the second lower electrode 262. The first supporter pattern 220 may include, e.g., at least one of silicon oxynitride, silicon nitride, a silicon carbonitride, and tantalum oxide.

The second supporter pattern 240 may be formed between the first supporter pattern 220 and the first contact plug 180, and between the first supporter pattern 220 and the second contact plug 181. The second supporter pattern 240 may surround a part of the first lower electrode 261. The second supporter pattern 240 may surround a part of the second lower electrode 262.

The second supporter pattern 240 may include, but is not limited to, silicon nitride. The second supporter pattern 240 may include the same material as or a different material from the first supporter pattern 220.

An etch stop layer 202 may be formed on the interlayer insulation layer 150 such that it does not overlap the first and second lower electrodes 261 and 262. The etch stop layer 202 will be described in detail below.

The capacitor dielectric film 270 may be formed, e.g., conformally, on the first lower electrode 261, the second lower electrode 262, the first supporter pattern 220, and the second supporter pattern 240. In detail, the capacitor dielectric film 270 may be conformally formed on the outer walls and the inner walls of each of the first lower electrode 261 and the second lower electrode 262. That is, the capacitor dielectric film 270 may be formed along the outer periphery 260 of the first lower electrode 261. In addition, the capacitor dielectric film 270 may be formed along the outer periphery of the second lower electrode 262.

The capacitor dielectric film 270 may be formed along the upper surface 220U of the first supporter pattern 220 and the lower surface 220L of the first support pattern 220. The capacitor dielectric film 270 may be conformally formed on the upper surface 220U of the first supporter pattern 220 and the lower surface 220L of the first support pattern 220.

The capacitor dielectric film 270 may be conformally formed on the second supporter pattern 240. Specifically, the capacitor dielectric film 270 may be formed along the upper surface and lower surface of the second supporter pattern 240.

The capacitor dielectric film 270 may be a single layer or multiple layers. The capacitor dielectric film 270 may include at least one of silicon oxide, silicon nitride, silicon oxynitride and a high-k dielectric material. For example, the high-k dielectric material may include, but is not limited to, at least one of: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The upper electrode 280 may be formed on the capacitor dielectric film 270. That is, the upper electrode 280 may be formed between the first lower electrode 261 and the second lower electrode 262, between the second supporter pattern 240 and the etch stop layer 220, and between the first supporter pattern 220 and the second supporter pattern 240. In addition, the upper electrode 280 may be formed, e.g., on the top surface of the second lower electrode 262.

In some embodiments, the upper electrode 280 may also be formed on the upper surface of the first supporter pattern 220, but this is merely illustrative. The upper electrode 280 may include, e.g., at least one of doped polysilicon, metal, conductive metal nitride and metal silicide.

The, e.g., entire, top surface of the first lower electrode 261 may be, e.g., directly, connected to the lower surface 220L of the first support pattern 220. A part of the top surface of the second lower electrode 262 may be connected to the lower surface 220L of the first support pattern 220. That is, only a portion of the top surface of the second lower electrode 262 may directly contact the lower surface 220L of the first support pattern 220, while a remaining portion of the top surface of the second lower electrode 262 may not directly contact the lower surface 220L of the first support pattern 220. The capacitor dielectric film 270 and the upper electrode 280 may be formed on the rest part of the top surface of the second lower electrode 262, e.g., the capacitor dielectric film 270 may be in direct contact with the portion of the top surface of the second lower electrode 262 that does not contact the lower surface 220L.

Hereinafter, a semiconductor device according to some exemplary embodiments will be described with reference to FIGS. 1, 2, 5 and 6. For clarity of illustration, descriptions will be made focusing on differences from the above exemplary embodiment and the redundant description will be omitted.

Figure 5:
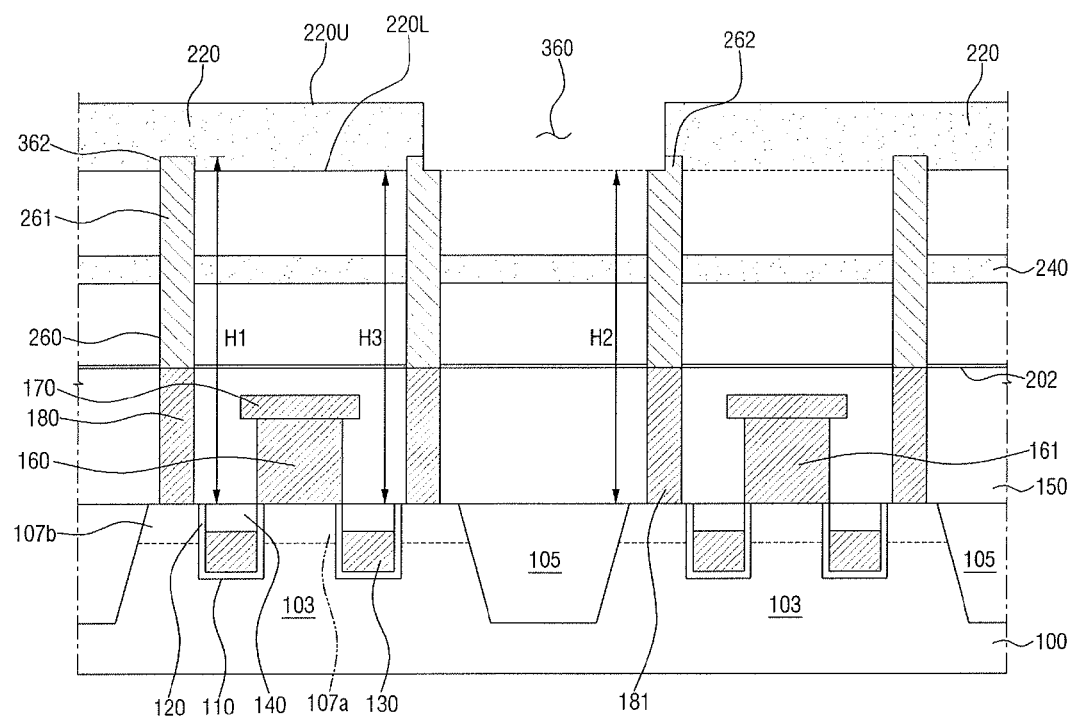
Figure 6:
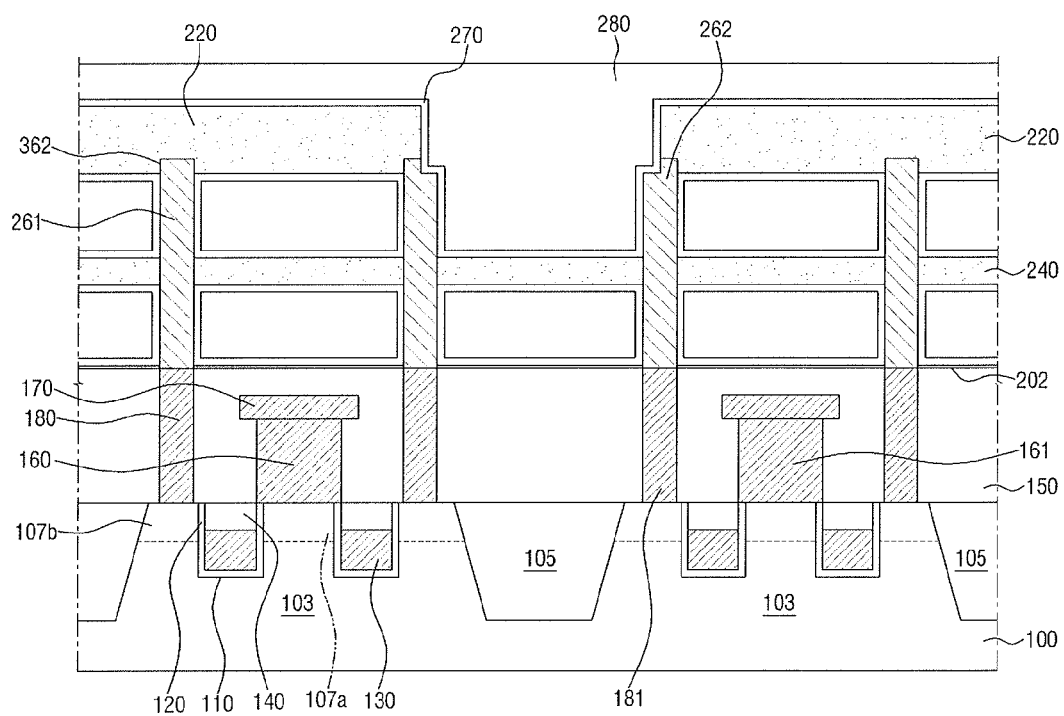

FIG. 5 is a cross-sectional view of the semiconductor device of FIGS. 1 and 2 taken along line A-A', before the capacitor dielectric film 270 and the upper electrode 280 are formed. FIG. 6 is a cross-sectional view of the semiconductor device of FIGS. 1 and 2 taken along line A-A', after the capacitor dielectric layer 270 and the upper electrode 280 are formed.

Referring to FIGS. 1, 2, 5 and 6, the semiconductor device according to an exemplary embodiment may include a recess 362 formed in the lower surface 220L of the first supporter pattern 220. In other words, the first supporter pattern 220 may include the recess 362 formed in the lower surface 220L thereof.

The bottom surface of the recess 362 formed in the lower surface 220L may be higher than the lower surface 220L of the first supporter pattern 220 relative to the substrate 100. In other words, the height from the substrate 100 to the bottom surface of the recess 362 formed in the lower surface 220L may be larger than the height from the substrate 100 to the lower surface 220L of the first supporter pattern 220. For example, the height from the substrate 100 to the bottom surface of the recess 362 formed in the lower surface 220L may be equal to the height H1 from the substrate 100 to the top surface of the first lower electrode 261.

In some embodiments, when the first supporter pattern 220 includes the recess 362 formed in the lower surface 220L, the first lower electrode 261 may be inserted into the recess 362 formed in the lower surface 220L. That is, the first lower electrode 261 may be extended into the first supporter pattern 220.

The height H1 from the substrate 100 to the top surface of the first lower electrode 261 may be different from the height H3 from the substrate 100 to the lower surface 220L of the first supporter pattern 220. For example, the height H1 from the substrate 100 to the top surface of the first lower electrode 261 may be larger than the height H3 from the substrate 100 to the lower surface 220L of the first supporter pattern 220.

The height H1 from the substrate 100 to the top surface of the first lower electrode 261 may be different from the height H2 from the substrate 100 to the top surface of the part of the second lower electrode 262 overlapped with the opening 360. For example, the height H1 from the substrate 100 to the top surface of the first lower electrode 261 may be larger than the height H2 from the substrate 100 to the top surface of the part of the second lower electrode 262 overlapped with the opening 360.

The height of a part of the top surface of the second lower electrode 262 that is exposed via the opening 360 from the substrate 100 may be different from the height of the other part thereof that is extended into the first supporter pattern 220. For example, the height from the substrate 100 to the part exposed via the opening 360 may be H2. For example, the height of the part of the top surface of the second lower electrode 262 that is extended into the first supporter pattern 220 from the substrate 100 may be equal to H1.

However, this is merely illustrative. The height from the substrate 100 to the top surface of the lower electrode may be only H1 like the first lower electrode 261, depending on the position the opening 360 is formed.

In the semiconductor device according to some exemplary embodiment, the height H1 from the substrate 100 to the top surface of the first lower electrode 261 may be equal to or larger than the height H3 from the substrate 100 to the lower surface 220L of the first supporter pattern 220. As a result, the contact area between the first supporter pattern 220 and the first lower electrode 261 is reduced, e.g., as compared to a contact area between an electrode extending to a top surface of a supporter pattern, so that the capacity of the capacitor can be maximized under the same aspect ratio.

In addition, in the semiconductor device according to some exemplary embodiment, the height H1 from the substrate 100 to the top surface of the first lower electrode 261 may be equal to or larger than the height H3 from the substrate 100 to the lower surface 220L of the first supporter pattern 220. As a result, the contact area between the first lower electrode 261 and the capacitor dielectric film 270 is increased, e.g., as compared to a case of no dielectric layer due to a supporter, so that the capacity of the capacitor can be maximized under the same aspect ratio.

In the semiconductor device according to some exemplary embodiments, the first lower electrode 261 is not extended to the upper surface 220U of the first supporter pattern 220. As a result, the aspect ratio is reduced under the same capacitance, so that processing difficulty can be reduced.

Hereinafter, a method for fabricating a semiconductor device according to some exemplary embodiments will be described with reference to FIGS. 1 to 4 and 7 to 11. For clarity of illustration, descriptions will be made focusing on differences from the above exemplary embodiments and redundant description will be omitted.

FIGS. 7 to 11 are cross-sectional views for illustrating stages of a method for fabricating a semiconductor device according to some exemplary embodiments, taken along line A-A' of FIGS. 1 and 2.

Referring to FIGS. 1 to 4 and 7 to 11, a first mold layer 301 may be formed on the substrate 100, a second supporter layer 241 may be formed on the first mold layer 301, and a second mold layer 302 may be formed on the second supporter layer 241.

Figure 7:
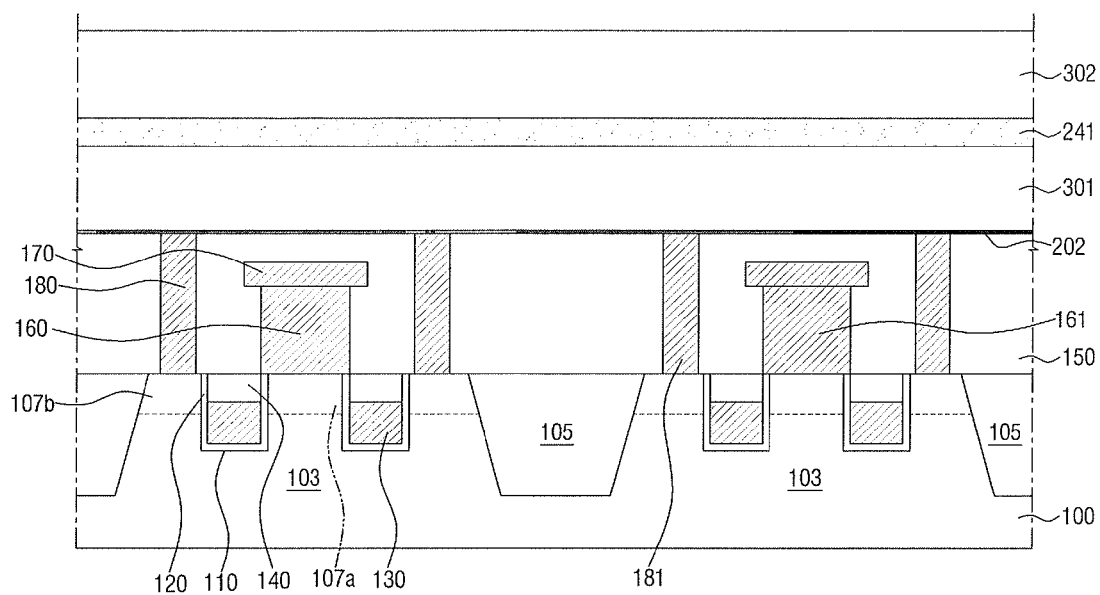
FIGS. 7 to 14 illustrate cross-sectional views of stages of a method for fabricating a semiconductor device according to some exemplary embodiments.

In detail, referring to FIG. 7, an etch stop layer 202 may be formed on an interlayer insulation layer 150 including the first contact plug 180, the second contact plug 181, the third contact plug 160, and the fourth contact plug 161. The etch stop layer 202 may include, but is not limited to, silicon nitride. For example, the etch stop layer 202 may include a material having an etch selectivity relative to a first mold layer 210 and a second mold layer 230 including oxide. The etch stop layer 202 may be formed by chemical vapor deposition (CVD), etc.

After forming the etch stop layer 202, the first mold layer 301, the second supporter layer 241, and the second mold layer 302 may be formed in this order. The first mold layer 301, the second supporter layer 241, and the second mold layer 302 may be formed by, but is not limited to, CVD.

The first mold layer 210 formed on the etch stop layer 202 may include silicon oxide. The first mold layer 210 may include, e.g., flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP), plasma enhanced oxide (PEOX), flowable CVD (FCVD) or a combination thereof.

The second supporter layer 241 may be formed on the first mold layer 210. The position of the second supporter layer 241 may be adjusted as desired, since etch time may change when a first contact hole 311 and a second contact hole 312 are formed as described below in FIG. 8.

When the first mold layer 301 and the second mold layer 302 include oxide, the second supporter pattern layer 241 may include, e.g., at least one of silicon oxynitride, silicon nitride, a silicon carbonitride, and tantalum oxide. However, this is merely illustrative, and the second supporter layer 241 may include a material having an etch selectivity relative to the first mold layer 301 and the second mold layer 302.

The second mold layer 302 may be formed on the second supporter layer 241. The second mold layer 302 may include at least one of the above-described oxides that may be included in the first mold layer 301. The second mold layer 230 may include PE-TEOS or HDP-CVD oxide.

After stacking the first mold layer 301, the second supporter layer 240, and the second mold layer 302 on the substrate 100, the first contact hole 311 and the second contact hole 312 may be formed. The first contact hole 311 and the second contact hole 312 may be extended in the thickness direction of the substrate 100.

Figure 8:
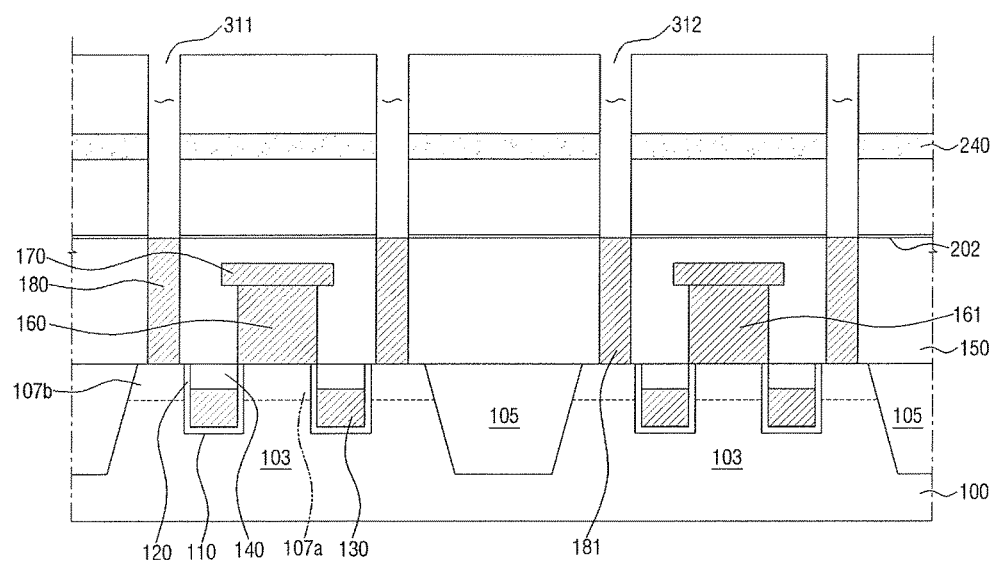

In detail, referring to FIG. 8, the first contact hole 311 and the second contact hole 312 may penetrate the first mold layer 301, the second supporter layer 240, and the second mold layer 302, to expose the upper surface of the etch stop layer 202. The first contact hole 311 and the second contact hole 312 may be formed by, e.g., a photolithography and etching process. However, this is merely illustrative, and the first contact hole 311 and the second contact hole 312 may be formed by a process including wet etching and/or dry etching. The first contact hole 311 and the second contact hole 312 may overlap, for example, the second source/drain region 107b.

As the first contact hole 311 and the second contact hole 312 are formed, portions of the exposed etch stop layer 202 may be removed via a selective etching process. As the etch stop layer 202 is removed, the top surface of the first contact plug 180 and the top surface of the second contact plug 181 may be exposed. After the first contact hole 311 and the second contact hole 312 are formed, the other portions of the etch stop layer 202 in the location where neither the first contact plug 180 nor the second contact plug 181 overlap may remain.

The second supporter pattern 240 may be formed, e.g., defined, by the first contact hole 311 and the second contact hole 312. The second supporter pattern 240 may surround the first contact hole 311 and the second contact hole 312.

Figure 9:
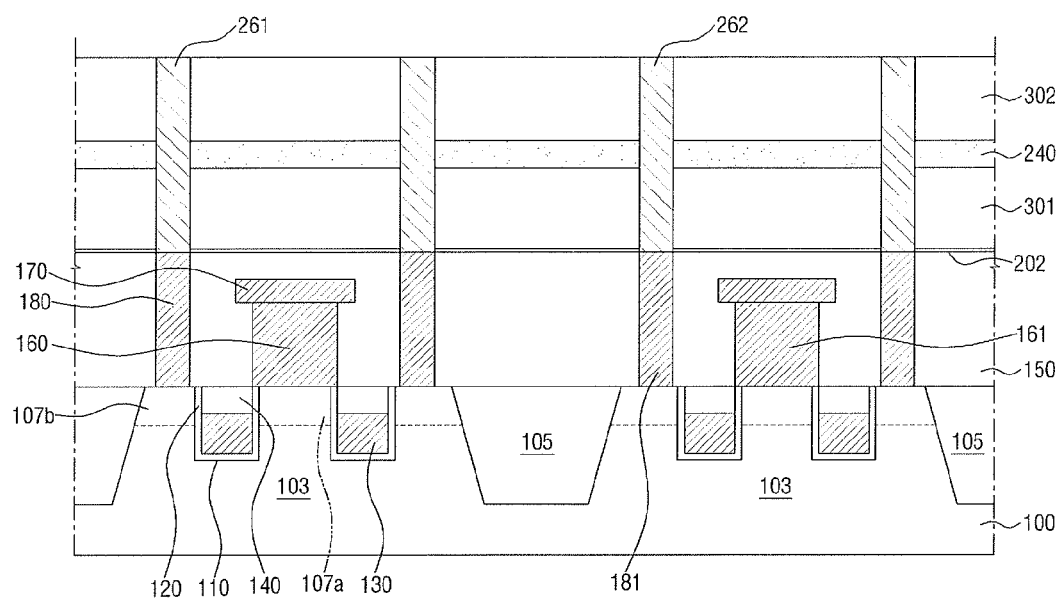

Referring to FIG. 9, the first lower electrode 261 and the second lower electrode 262 may be formed in the first contact hole 311 and the second contact hole 312, respectively. The first contact hole 311 and the second contact hole 312 may be filled with the first lower electrode 261 and the second lower electrode 262, respectively. That is, the first lower electrode 261 and the second lower electrode 262 may have a pillar shape.

Figure 10:
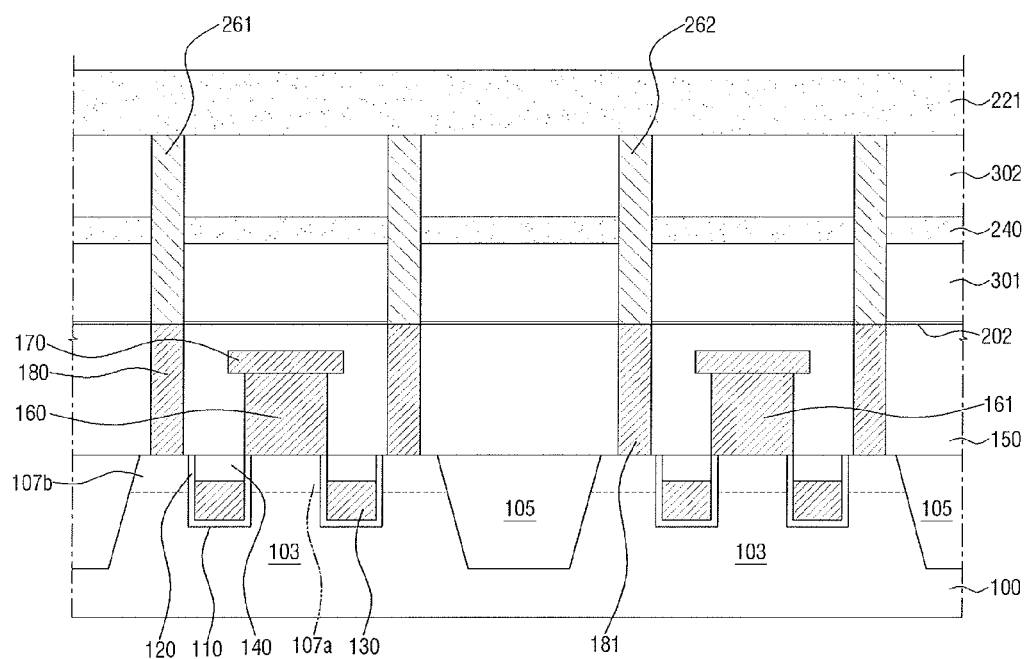

Referring to FIG. 10, the first supporter layer 221 may be formed on the second mold layer 302, the first lower electrode 261, and the second lower electrode 262. In some embodiments, the first supporter layer 221 may come in direct contact with the top surface of the first lower electrode 261. The first supporter layer 221 may be formed by, but is not limited to, chemical vapor deposition (CVD), atomic layer deposition (ALD), a planarization process, etc.

Figure 11:
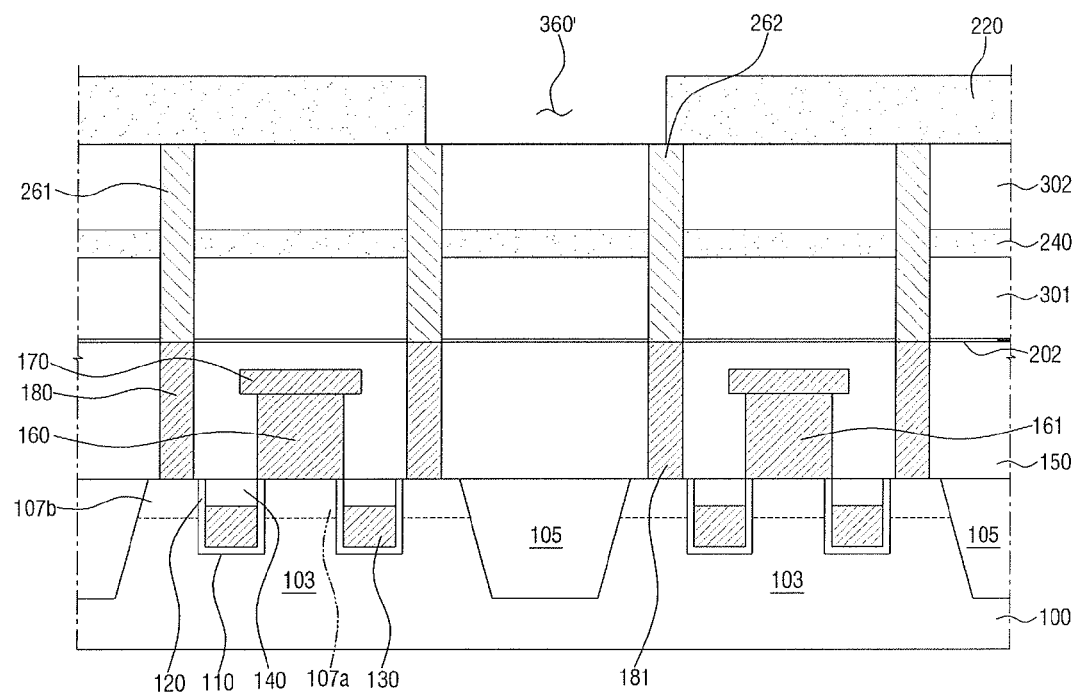

Referring to FIG. 11, the first supporter pattern 220 may be formed by patterning the first supporter layer 221 using a photolithography and etching process or the like. Specifically, a part of the first supporter layer 221 is removed, and a second trench 360' is formed in the supporter layer 221, such that the first supporter pattern 220 may be formed. As the second trench 360' is formed, a part of the upper surface of the second mold layer 302 and a part of the top surface of the second lower electrode 262 may be exposed.

In other words, the bottom surface of the second trench 360' may be defined by the part of the top surface of the second lower electrode 262 and the upper surface of the second mold layer 302. In addition, two side walls of the second trench 360' may be defined by the first supporter pattern 220.

Next, referring to FIGS. 3-4, portions of the first mold layer 301 and the second mold layer 302 may be removed, so that the opening 360 may be formed. The first mold layer 301 and the second mold layer 302 may be removed by a selective etching process. As the first mold layer 301 and the second mold layer 302 are removed, the upper surface of the second supporter pattern 240, as well as a part of the top surface of the second lower electrode 262, may be exposed.

Referring to FIG. 4, the capacitor dielectric film 270 may be conformally formed on the first lower electrode 261, the second lower electrode 262, the upper surface and lower surface of the first supporter pattern 220, and the upper surface of the etch stop layer 202. The upper electrode 280 may be formed on the capacitor dielectric film 270.

Hereinafter, a method for fabricating a semiconductor device according to some exemplary embodiments will be described with reference to FIGS. 1, 2, 5, 6, and 12 to 14. For clarity of illustration, descriptions will be made focusing on differences from the above exemplary embodiments and redundant description will be omitted.

Figure 12:
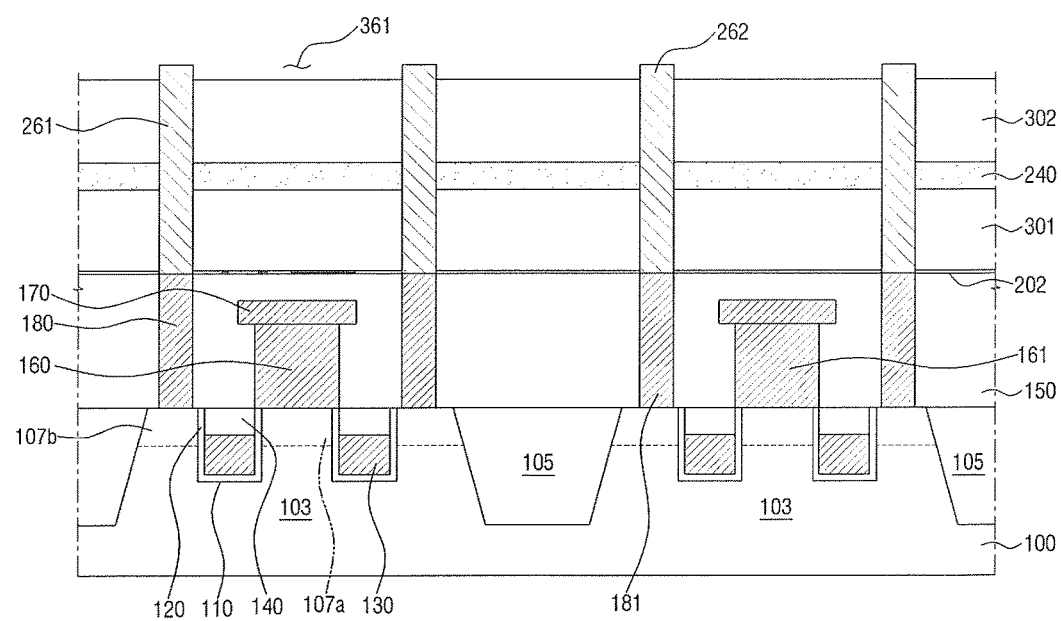
Figure 13:
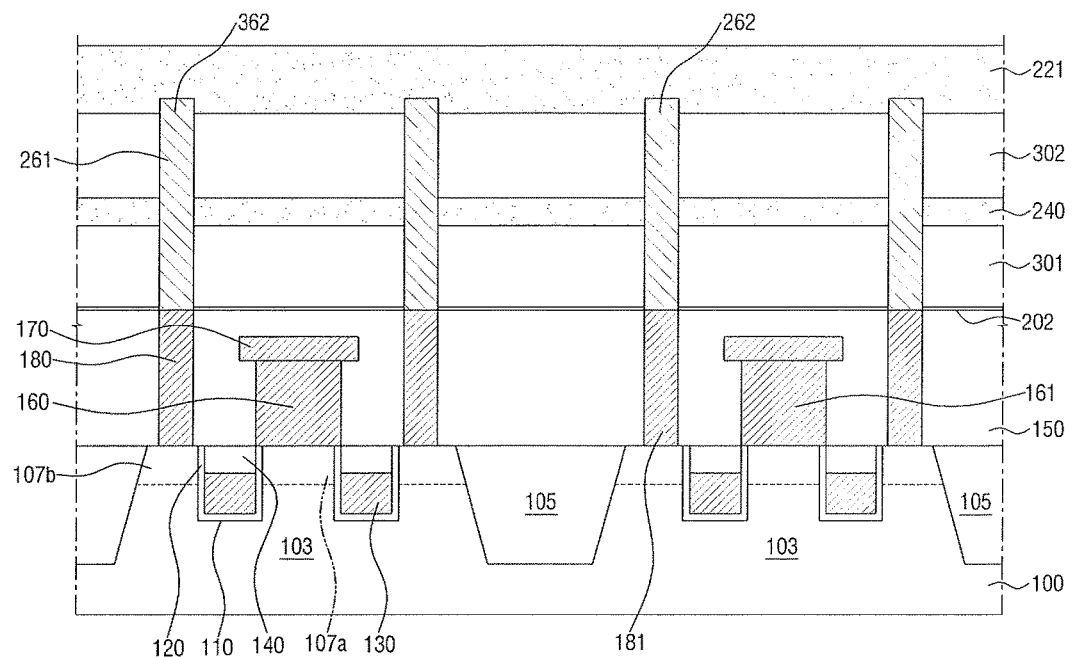
Figure 14:
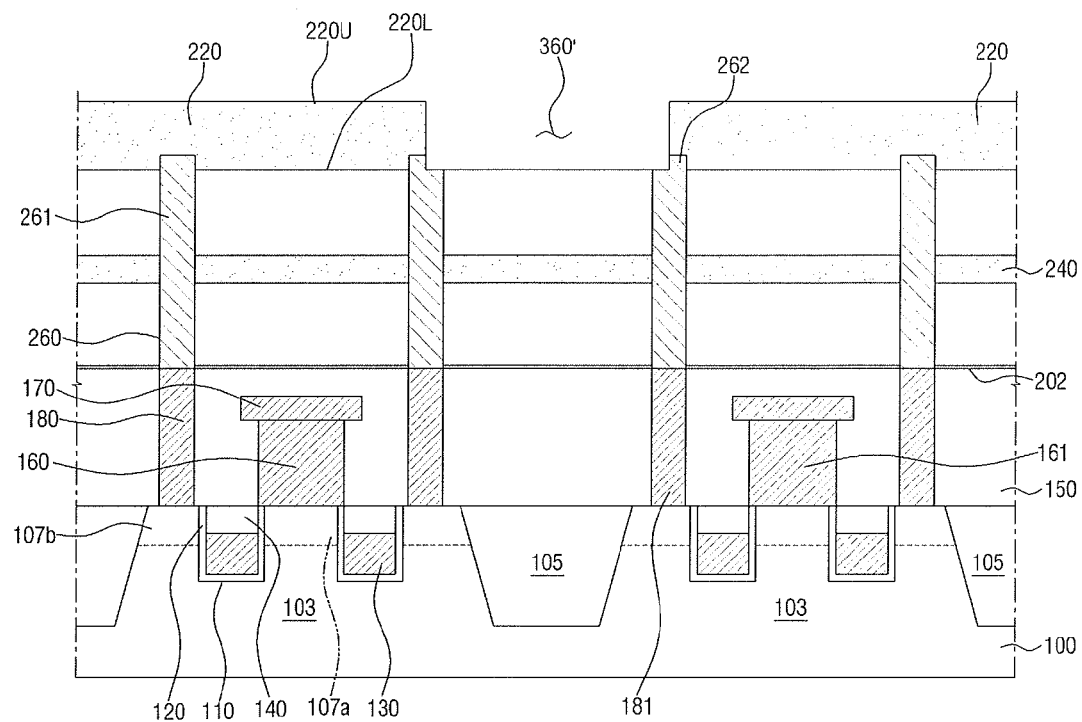

FIGS. 12 to 14 are cross-sectional views for illustrating stages of a method for fabricating a semiconductor device according to some exemplary embodiments, taken along line A-A' of FIGS. 1 and 2.

Referring to FIGS. 1, 2, 5, 6, and 12 to 14, after forming the first lower electrode 261 and the second lower electrode 262, a recess 361 may be formed before a first supporter film 221 is formed.

The recess 361 may be formed in the second mold layer 302 by selectively etching the upper surface of the second mold layer 302. The bottom surface of the recess 361 may be defined by the second mold layer 302. The side walls of the recess 361 may be defined by the first lower electrode 261. In other words, as illustrated in FIG. 12, the first and second lower electrodes 261 and 262 may protrude above the second mold layer 302.

Referring to FIG. 13, the recess 361 may be filled with the first supporter layer 221. The first supporter layer 221 may be formed on the second mold layer 302, the upper surface of the first lower electrode 261, and the upper surface of the second lower electrode 262. Referring to FIG. 14, the first supporter pattern 220 may be formed by removing a part of the first supporter layer 221. Specifically, by forming the second trench 360' for exposing the top surface of the second lower electrode 262 in the first supporter layer 221, the first supporter pattern 220 may be formed.

In some embodiments, a part of the first lower electrode 261 may be extended into the first supporter pattern 220. Also in this case, however, the height H1 from the substrate 100 to the top surface of the first lower electrode 261 may be larger than the height H3 from the substrate 100 to the lower surface 220L of the first supporter pattern 220.

Figure 15:
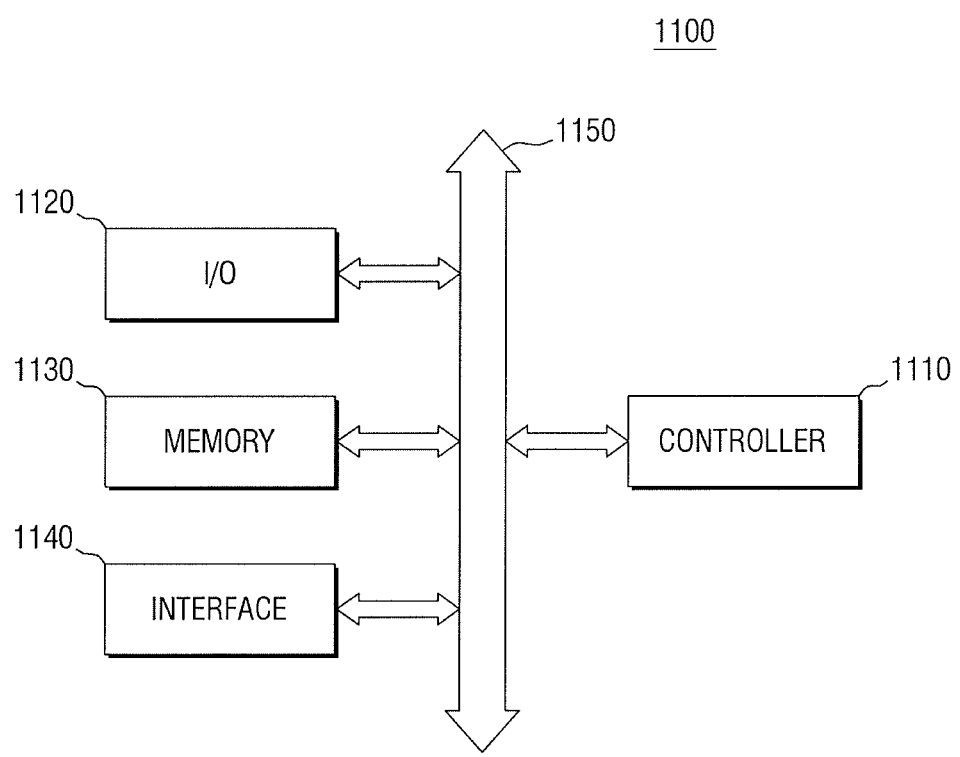
FIG. 15 illustrates a block diagram of an example of an electronic system including a semiconductor device manufactured using any one of the methods for manufacturing a semiconductor device according to some exemplary embodiments.

FIG. 15 is a block diagram of an example of an electronic system including the semiconductor device fabricated using any one of the methods for fabricating a semiconductor device according to some exemplary embodiments.

Referring to FIG. 15, the electronic system 1100 according to some exemplary embodiments may include a controller 1110, an I/O (input/output) device 1120, a memory device 1130, an interface 1140, and a bus 1150. The controller 1110, the I/O device 1120, the memory device 1130, and/or the interface 1140 may be connected to one another via the bus 1150. The bus 1150 may serve as a path via which data is transferred.

The controller 1110 may include at least one of a microprocessor, a digital signal processor, a microcontroller, and logic elements capable of performing similar functions. The I/O device 1120 may include a keypad, a keyboard, a display device, etc. The memory device 1130 may store therein data and/or instructions, for example. The memory device 1130 may include any of the semiconductor devices according to some exemplary embodiments. The memory device 1130 may include a DRAM. The interface 1140 may be capable of transmitting/receiving data to/from a communication network. The interface 1140 may be either a wired or wireless interface. For example, the interface 1140 may include an antenna, a wired/wireless transceiver or the like.

The electronic system 1100 may be applied to a PDA (personal digital assistant), a portable computer, a web tablet, a wireless phone, a mobile phone, a digital music player, a memory card, or any electronic device capable of transmitting/receiving information in wireless environment.

Figure 16:
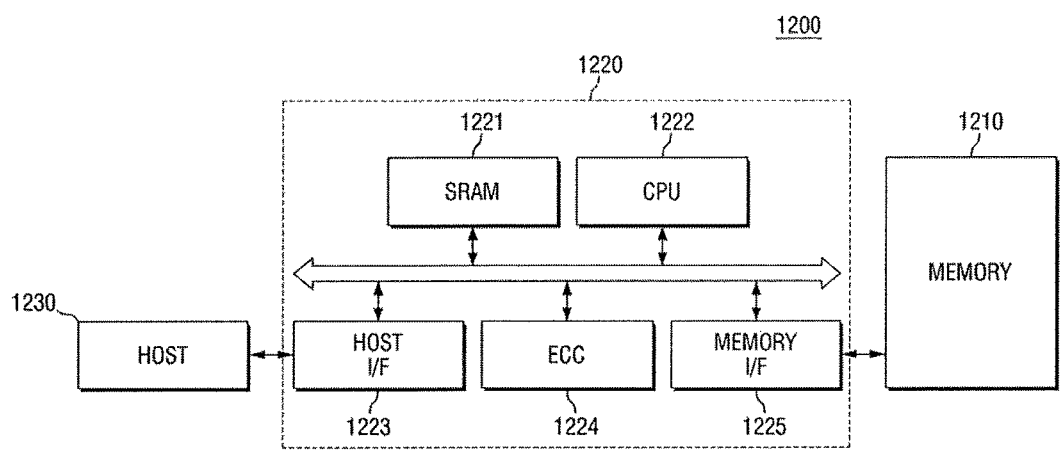
FIG. 16 illustrates a block diagram of an example of a memory card including a semiconductor device manufactured using any one of the methods for manufacturing a semiconductor device according to some exemplary embodiments.

FIG. 16 is a block diagram of an example of a memory card including the semiconductor device fabricated using any one of the methods for fabricating a semiconductor device according to some exemplary embodiments.

Referring to FIG. 16, a memory 1210 including a semiconductor device fabricated using any of various exemplary embodiments may be employed in a memory card 1200. The memory card 1200 may include a memory controller 1220 for controlling data exchange between a host 1230 and the memory 1210. A static random-access memory (SRAM) 1221 may be used as an operation memory of a central processing unit 1222. A host interface 1223 may include a protocol that the host 1230 can use to connect to the memory card 1200 to exchange data. An error correction code 1224 may detect and correct an error in data read from the memory 1210. A memory interface 1225 may interface the memory 1210. The central processing unit 1222 may perform overall control operations associated with data exchange by the memory controller 1220.

By way of summation and review, a first lower electrode may not extend to an upper surface of a supporter pattern. As a result, the aspect ratio of the first lower electrode is reduced under the same capacitance, so that processing may be simplified. Moreover, the contact area between the first lower electrode and the capacitor dielectric film may be increased, so that the capacity of the capacitor can be maximized under the same aspect ratio. In contrast, if a capacitor dielectric film were not deposited on the lower electrode because of the supporter pattern, loss of capacitance and reduced capacitance of the capacitor may occur due to low contact area between the lower electrode and the dielectric.

Therefore, aspects of the present disclosure provide a semiconductor device capable of maximizing the capacity of a capacitor by reducing the contact area between a supporter pattern and a lower electrode of the capacitor, and a method for fabricating the same. Also, aspects of the present disclosure provide a semiconductor device capable of maximizing the capacity of a capacitor by increasing the contact area between a lower electrode of the capacitor and a dielectric film, and a method for fabricating the same.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first contact plug on a substrate;
a first lower electrode on the first contact plug, the first lower electrode extending in a thickness direction of the substrate;
a first supporter pattern on the first lower electrode, the first supporter pattern including an upper surface and a lower surface, the upper surface of the first supporter pattern being higher than a top surface of the first lower electrode;
a dielectric film on the first lower electrode, on the upper surface of the first supporter pattern, and on the lower surface of the first supporter pattern; and
an upper electrode on the dielectric film,
wherein the first supporter pattern is disposed to cover at least a part of the first lower electrode.

2. The semiconductor device as claimed in claim 1, wherein the top surface of the first lower electrode is connected to the lower surface of the first supporter pattern.

3. The semiconductor device as claimed in claim 1, wherein the first supporter pattern includes a recess in the lower surface of the first support pattern, a part of the first lower electrode being inserted into the recess.

4. The semiconductor device as claimed in claim 1, wherein a height from the substrate to the top surface of the first lower electrode is equal to a height from the substrate to the lower surface of the first supporter pattern.

5. The semiconductor device as claimed in claim 1, wherein a height from the substrate to the top surface of the first lower electrode is larger than a height from the substrate to the lower surface of the first supporter pattern.

6. The semiconductor device as claimed in claim 1, wherein the first lower electrode has a pillar shape, and the dielectric film extends along an outer periphery of the first lower electrode.

7. The semiconductor device as claimed in claim 1, wherein the first supporter pattern includes an opening, and the semiconductor device further comprises:
a second contact plug on the substrate, the second contact plug overlapping the opening; and
a second lower electrode connected to the second contact plug.

8. A semiconductor device, comprising:
a first contact plug on a substrate;
a first supporter pattern on the substrate, the first supporter pattern including a first surface and a second surface opposed to each other;
a first lower electrode between the substrate and the first surface of the first supporter pattern, the first lower electrode being connected to the first contact plug;
a dielectric film on the first lower electrode, on the first surface of the first supporter pattern, and on the second surface of the first supporter pattern; and
an upper electrode disposed on the dielectric film,
wherein the first supporter pattern is disposed to cover at least a part of the first lower electrode.

9. The semiconductor device as claimed in claim 8, wherein a top surface of the first lower electrode is connected to the first surface of the first supporter pattern.

10. The semiconductor device as claimed in claim 8, wherein the first supporter pattern includes a recess in the first surface of the first support pattern, a part of the first lower electrode being inserted into the recess.

11. The semiconductor device as claimed in claim 8, wherein a height from the substrate to the second surface of the first supporter pattern is larger than a height from the substrate to a top surface of the first lower electrode.

12. The semiconductor device as claimed in claim 8, wherein a height from the substrate to the first surface of the first supporter pattern is equal to a height from the substrate to a top surface of the first lower electrode.

13. The semiconductor device as claimed in claim 8, wherein a height from the substrate to the top surface of the first lower electrode is larger than a height from the substrate to the first surface of the first supporter pattern.

14. The semiconductor device as claimed in claim 8, wherein the first lower electrode has a pillar shape, the dielectric film extending along an outer periphery of the first lower electrode.

15. The semiconductor device as claimed in claim 8, wherein the first supporter pattern includes an opening, and the semiconductor device further comprises:
   a second contact plug on the substrate, the second contact plug overlapping the opening; and
   a second lower electrode connected to the second contact plug.

16. A semiconductor device, comprising:
   a first contact plug on a substrate;
   a first lower electrode on the first contact plug, the first lower electrode having a pillar shape;
   a first supporter pattern on the first lower electrode, a distance between a top of the substrate and a top of the first supporter pattern being larger than a distance between the top of the substrate and a top of the first lower electrode;
   a dielectric film on the first lower electrode and on the first supporter pattern; and
   an upper electrode on the dielectric film,
   wherein the first supporter pattern is disposed to cover at least a part of the first lower electrode.

17. The semiconductor device as claimed in claim 16, wherein the dielectric film covers all surfaces of the first supporter pattern except portions of surfaces of the first supporter pattern directly contacting the first lower electrode.

18. The semiconductor device as claimed in claim 17, wherein the dielectric film is conformal on the first supporter pattern with the first lower electrode.

19. The semiconductor device as claimed in claim 16, wherein the top of the first lower electrode is in direct contact with the first supporter pattern.

20. The semiconductor device as claimed in claim 16, wherein the top of the first lower electrode is coplanar with a bottom of the first supporter pattern.

* * * * *